United States Patent [19]
Tung

[11] Patent Number: 6,102,720
[45] Date of Patent: Aug. 15, 2000

[54] EJECTOR MECHANISM WITH ELASTIC MEANS IN RECEPTACLE

[75] Inventor: Shun-Chi Tung, Tu-Chen, Taiwan

[73] Assignee: Hon Hai Precision Ind. Co., Ltd., Taipei Hsien, Taiwan

[21] Appl. No.: 09/217,688

[22] Filed: Dec. 21, 1998

[30] Foreign Application Priority Data

Apr. 28, 1998 [TW] Taiwan .................................. 87206643

[51] Int. Cl.[7] .................................................. H01R 13/62
[52] U.S. Cl. ............................................. 439/159; 439/923
[58] Field of Search .................................... 439/159, 155, 439/156, 160, 923, 352; 361/754, 798, 727, 725, 737, 684, 686, 796, 801, 802

[56] References Cited

U.S. PATENT DOCUMENTS

| | | | |
|---|---|---|---|
| 5,155,663 | 10/1992 | Harase | 361/684 |
| 5,220,520 | 6/1993 | Kessoku | 361/684 |
| 5,938,466 | 8/1999 | Suzuki et al. | 439/352 |

*Primary Examiner*—Brian Sircus
*Assistant Examiner*—Brian S. Webb

[57] ABSTRACT

An ejector mechanism for a connector comprises a receptacle and an elastic device deformably received in the receptacle. An ejection plate is adapted to force the elastic device to deform and store tension when an external card is manually inserted into the connector and exerts a force on the ejection plate. A retaining member is movably retained in the connector for retaining the elastic device at the deformed status. A releasing device is connected to the retaining member for releasing the retention of the retaining member to the elastic device thereby causing the ejection plate to eject the card via release of the tension stored in the elastic device.

10 Claims, 6 Drawing Sheets

EJECTOR MECHANISM WITH ELASTIC MEANS IN RECEPTACLE

BACKGROUND OF THE INVENTION

1. Field of the Invention

The present invention relates to an ejector mechanism of a connector, and especially to an ejector mechanism for use in a PCMCIA connector.

2. The Prior Art

PCMCIA card connectors have become popular in portable computers. The card connectors are commonly configured with an ejector mechanism having a lever for driving an ejecting plate to disconnect and eject IC cards therefrom.

A conventional ejector mechanism, as shown in FIG. 1, comprises a lever 10 having a fulcrum 18 formed at an intermediate portion thereof for pivotably fixing to a header portion 17 of a PCMCIA connector 19. The header portion 17 is fixed to a front end of a frame 14. Normally, an IC card 15 is inserted from a rear end of the frame 14 to engage with the header portion 17 of the connector 19. The lever 10 has a first end movably connected to a push bar 12 and driven thereby to pivot about the fulcrum 18. A handle 13 is formed at one end of the push bar 12. A second end of the lever 10 is connected to an ejection plate 11 which is activated by a driving force from the lever 10 when a force is exerted on the push bar 12. The lever 10 is shown in two sets of phantom lines to illustrate the movement thereof. The phantom line portions of the handle 13 and the IC card 15 also illustrate the respective movements thereof.

A drawback of this design is that a portion of the handle 13 extends beyond the rear end of the frame 14 thereby occupying excess space and potentially damaging the handle 13 due to an external force acting thereon. In addition, a predetermined force must be exerted on the handle 13 to withdraw the IC card 15 from the connector. Moreover, the lever structure is complicated thereby increasing manufacturing costs.

Therefore, it is requisite to provide a new ejector mechanism which does not require a lever whereby a card can be ejected therefrom with less force than the prior art.

SUMMARY OF THE INVENTION

The primary purpose of the present invention is to provide an ejector mechanism for a card connector which occupies a limited space and requires a limited operational force.

The second purpose of the present invention is to provide an ejector mechanism which utilizes elastic means for ejecting a card.

In accordance with one aspect of the present invention, an ejector mechanism for a connector comprises a receptacle and elastic means deformably received in the receptacle. An ejection plate is adapted to force the elastic means to deform and store tension when an external card is manually inserted into the connector. A retaining member is movably retained in the connector for retaining the elastic means at the deformed status. A releasing means is connected to the retaining member for releasing the retention of the retaining member on the elastic means thereby causing the ejection plate to eject the card via the release of tension from the elastic means.

In accordance with another aspect of the present invention, an ejector mechanism for a connector comprises a receptacle and elastic means deformably received in the receptacle. An ejection plate is adapted to exert a force in a first direction causing the elastic means to deform, store tension and extend in a second direction substantially perpendicular to the first direction when an external card is manually inserted into the connector in the first direction. A retaining member is movably retained in the connector for retaining the elastic means at the deformed status after the elastic means extends in the second direction a predetermined distance. Releasing means is connected to the retaining member for releasing the retention of the retaining member on the elastic means thereby causing the ejection plate to eject the card via release of the tension from the elastic means.

These and additional objectives, features, and advantages of the present invention will become apparent after reading the following detailed description of the preferred embodiment taken in conjunction with the appended drawing figures.

DETAILED DESCRIPTION OF THE PREFERRED EMBODIMENT

Figure 3:
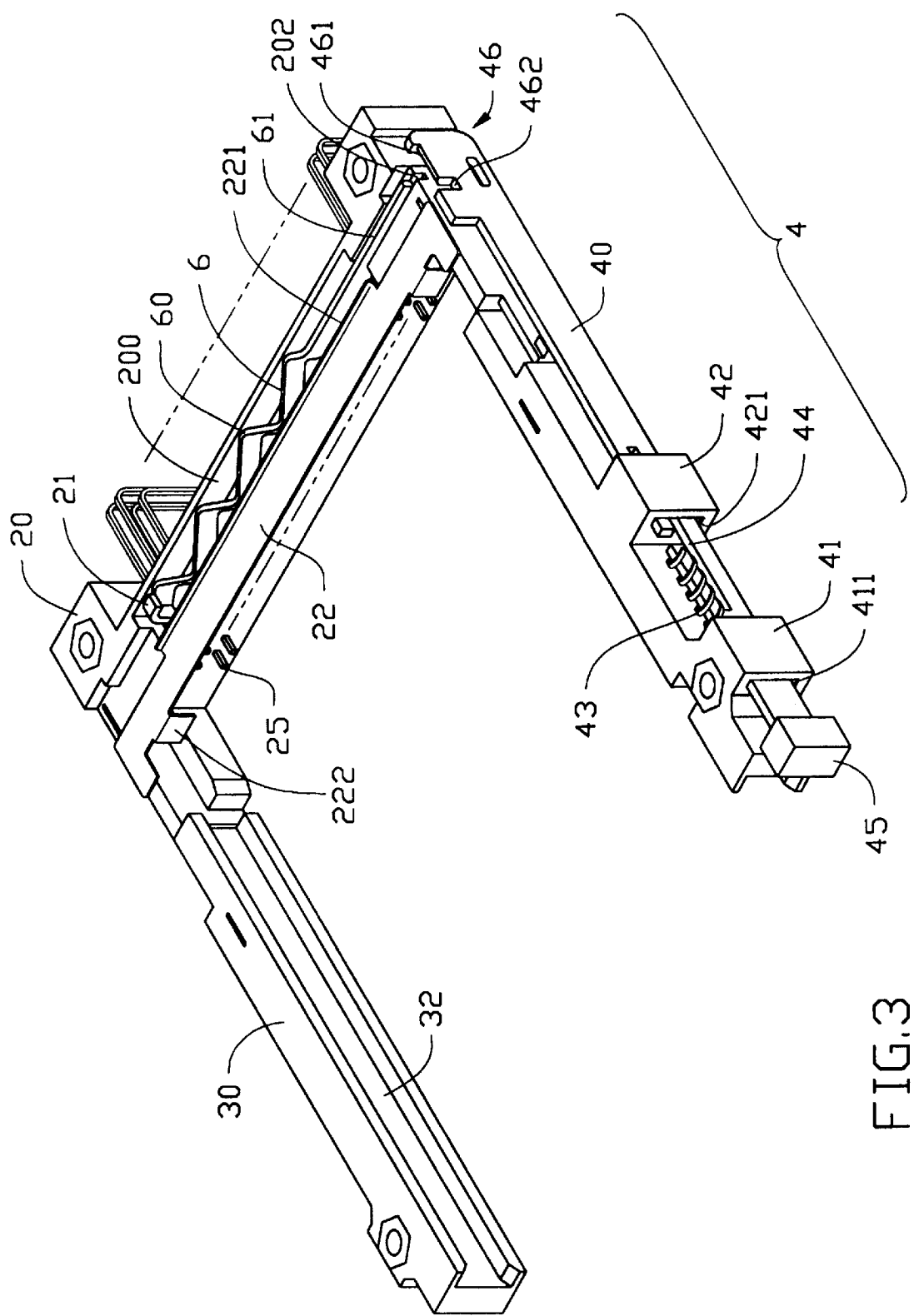
FIG. 3 is similar to FIG. 2 wherein a cover is removed therefrom to clearly show elastic means fixed to a top portion of the header.

Referring to FIG. 3, an ejector mechanism 4 in accordance with the present invention comprises a receptacle 200 formed at a top of a header 20. The receptacle 200 defines an opening 202 laterally communicating with an exterior. The header 20 retains contacts 25 therein for electrically engaging with an IC card (not shown).

Elastic means 6 positioned in the receptacle 200 comprises a deformable portion 60 and a straight portion 61. The deformable portion 60 has a continuous wave shape loosely retained in the receptacle 200 and an upper portion thereof extends beyond an upper surface of the header 20. The straight portion 61 has a thickness less than the width of the opening 202 and a line extrapolated therefrom extends through the opening 202 of the receptacle 200. The elastic means 6 is made from a metal strip via stamping and bending. A hook 21 extends upward from a free end of the deformable portion 60 and has an upper end extending beyond an overall surface of the elastic means 6.

A pair of guiding arms 30 are connected to opposite ends of the header 20. Each guiding arm 30 defines an inner channel 32 exposed toward each other for cooperating to receive an IC card (not shown). A first closure 41 and a second closure 42 are integrally formed on an outer side of one of the guiding arms 30 and respectively define a first passageway 411 and a second passageway 421 substantially in alignment with each other along a longitudinal direction of the guiding bar 30. A push bar 40 is slidably received in the passageways 411, 421 and a handle portion 45 is attached to one end thereof for manual operation. The push bar 40 may be made of metal or plastic. A spring 43 is fixed to a reception portion 44 of the push bar 40 and is limited within a space defined between the two closures 41, 42 for generating a biasing force to return the handle portion 45 to its undepressed position after the handle portion 45 is depressed to activate the push bar 40.

A retaining member 46 is formed at an opposite end of the push bar 40 substantially extending along the extrapolated line of the straight portion 61 of the elastic means 6. The retaining member 46 comprises a plate head 461 which defines an upper cutout 462 having a width substantially greater than the thickness of the straight portion 61 of the elastic means 6.

Figure 4:
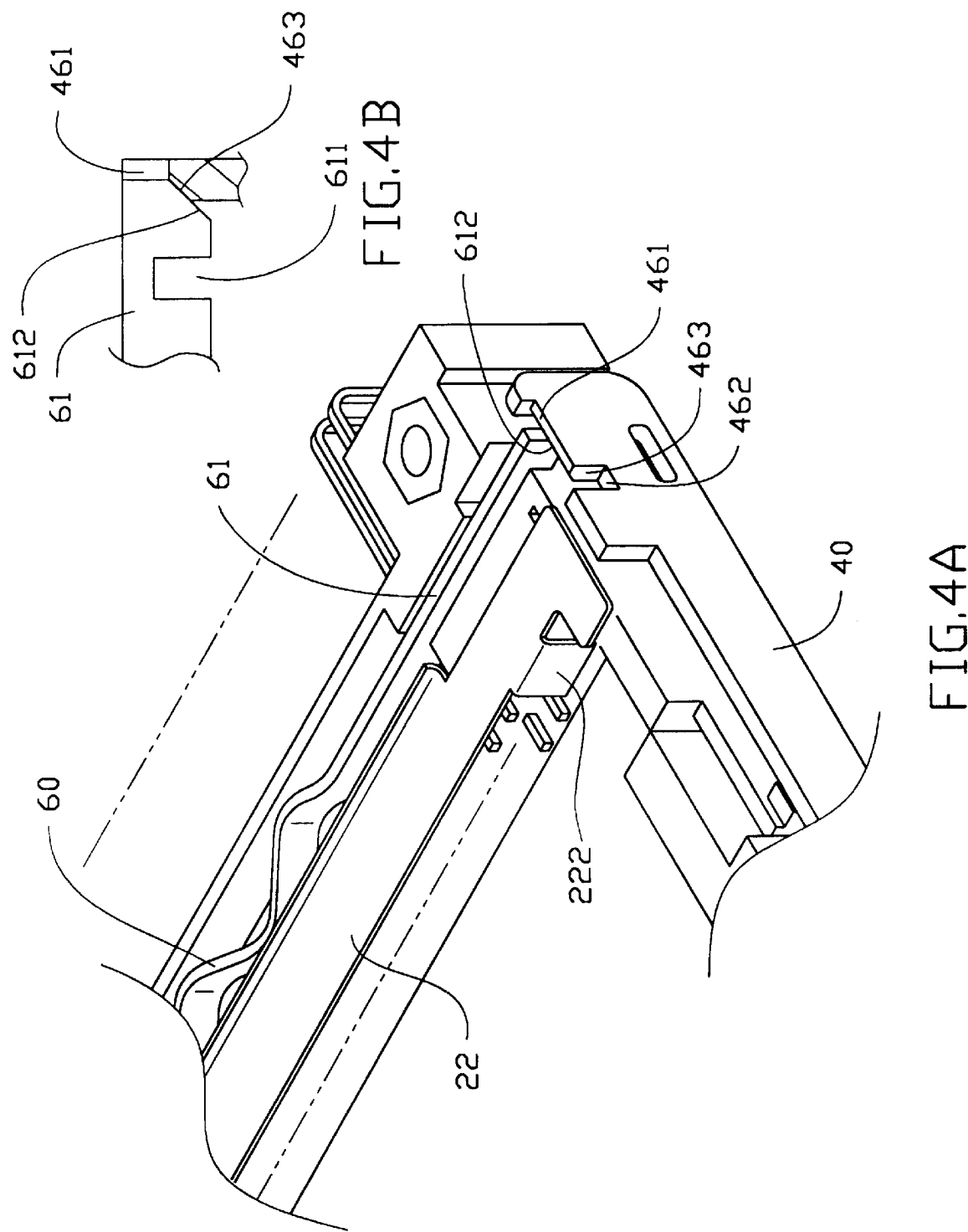
FIG. 4A is a partial, enlarged view of FIG. 3.
FIG. 4B is a schematic view of a guiding member of the elastic means and a guiding surface of a push bar showing a mating relation therebetween.

Also referring to FIGS. 4A and 4B, a lower edge of the plate head 461 forms a tapered edge 463 confronting a slant face 612 formed on a lower corner of a free end of the straight portion 61 of the elastic means 6. A lower cutout 611 is defined in the straight portion 61 of the elastic means 6 having a width substantially greater than the thickness of the retaining member 46 of the push bar 40. An ejection plate 22 is positioned on the header 20 and comprises a curved wall 221 projecting upward from a rear edge thereof and two ejection tabs 222 extending downward from a front edge near end portions thereof.

Figure 1:
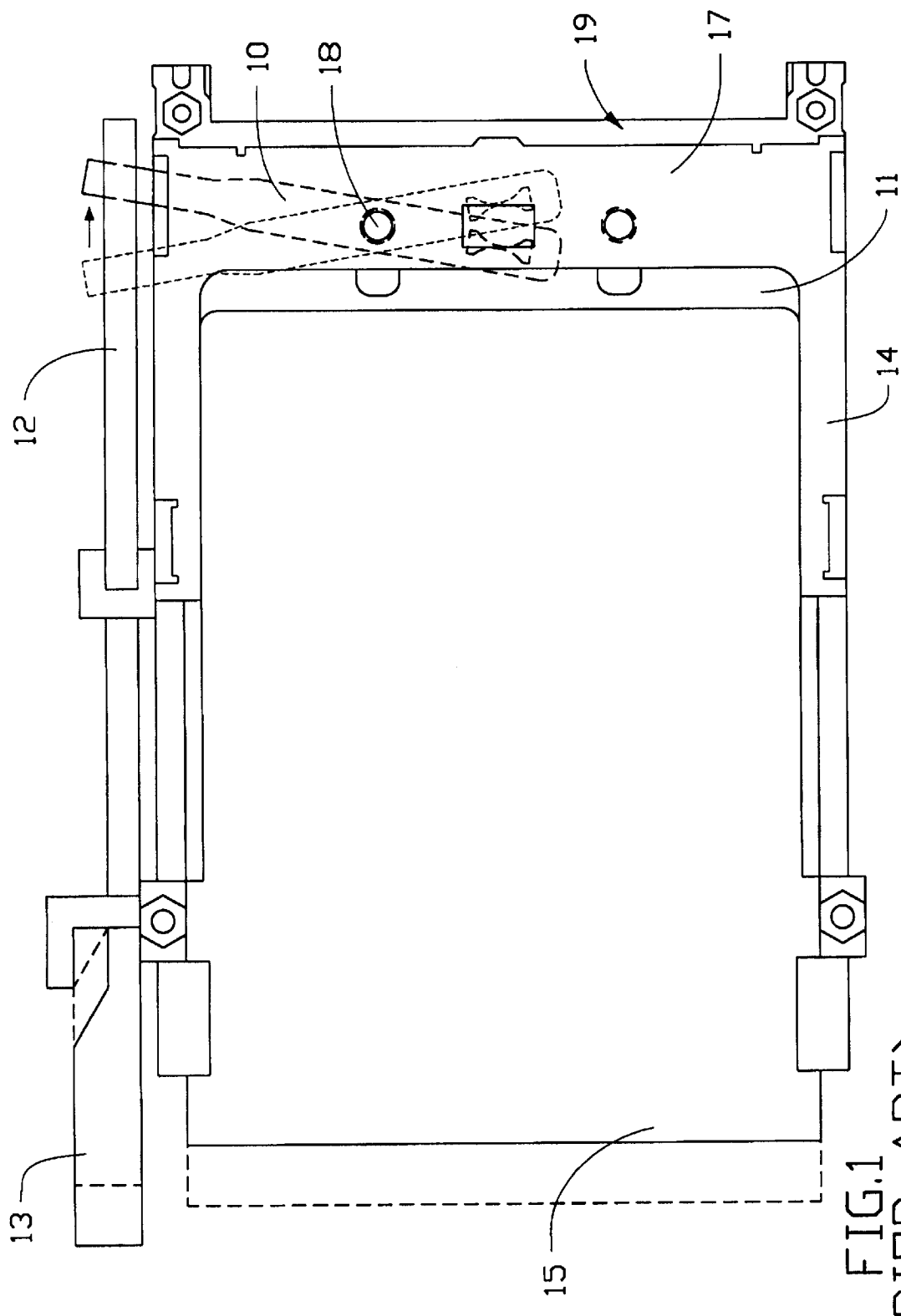
FIG. 1 is a schematic view of a conventional PCMCIA card connector.
Figure 2:
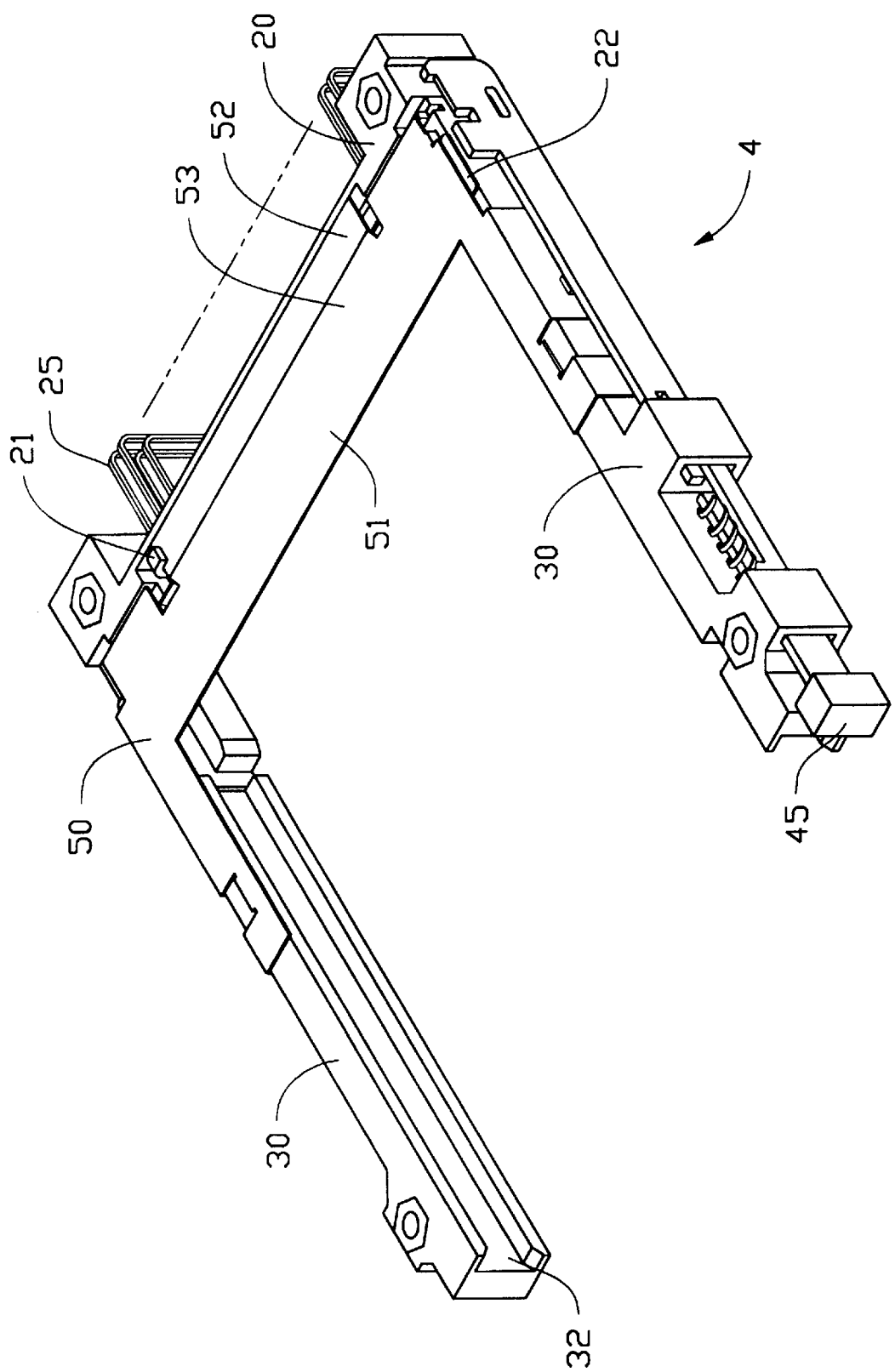
FIG. 2 is a perspective view of a PCMCIA connector in accordance with the present invention.

Referring to FIG. 2, a substantially U-shaped cover 50 is fixed to the header 20 and the guiding arms 30, and covers most of the ejection plate 22 while allowing the ejection plate 22 to move thereunder. Clearance is provided between the hook 21 and an upper edge of a periphery of the receptacle 200 for facilitating installation of the cover 50. The cover 50 comprises a first flat portion 51, an inclined portion 53 extending upward from an edge of the first flat portion 51, and a second flat portion 52 extending horizontally from an edge of the inclined portion 53 and abutting the hook 21 of the elastic means 6. The second flat portion 52 exists at a higher level than the first flat portion 51 for preventing contact with the elastic means 6 disposed thereunder.

Figure 5:
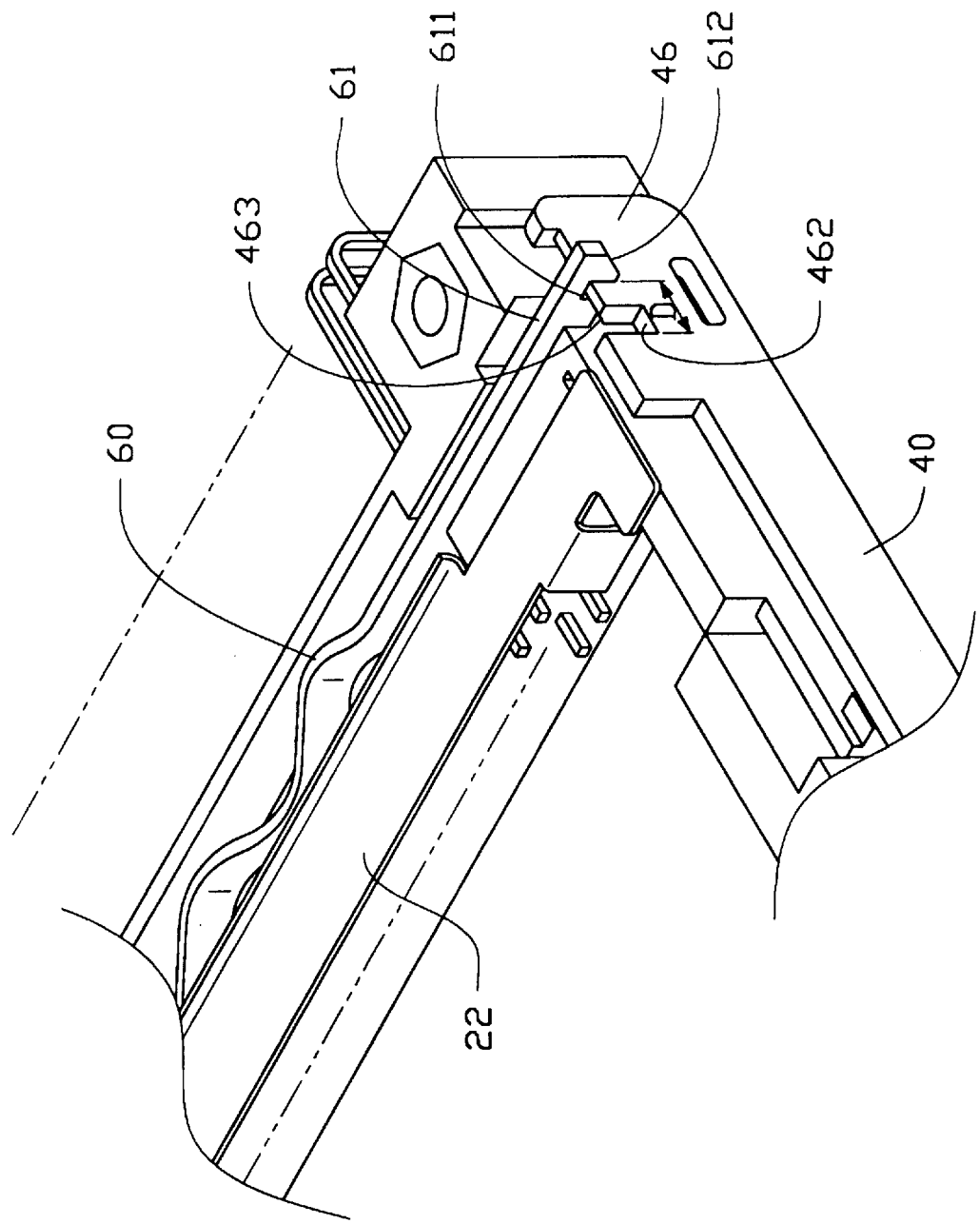
FIG. 5 is similar to FIG. 4A wherein the elastic means is depressed by an ejection plate and retained in a locked status.

Referring to FIGS. 4A, 4B and 5, when an IC card (not shown) is inserted into the connector, the ejection plate 22 is moved forward whereby the curved wall 221 thereof deforms the deformable portion 60 of the elastic means 6 causing the slant face 612 of the straight portion 61 of the elastic means 6 to move outward through the opening 202 of the receptacle 200 and slide over the tapered edge 463 of the movable plate 461 until the lower cutout 611 engages with a wall of the engaging portion 46 of the push bar 40. Specifically, when the deformable portion 60 of the elastic means 6 is depressed by the ejection plate 22, the amplitude of its wave shape will be decreased while the overall lateral length thereof will be extended, and therefore, the straight portion 61 will be accordingly displaced outward to slide over the plate head 461 of the push bar 40. At this status, the elastic means 6 will remain in its deformed shape due to the engagements of two ends 21, 611 of the elastic means 6 to the second flat portion 52 of the cover 50 and the engaging portion 46 of the push bar 40, respectively. The lower cutout 611 of the elastic means 6 is spaced from the upper cutout 462 of the push bar 40 a relatively small distance D when the elastic means 6 is retained in the deformed status.

Figure 6:
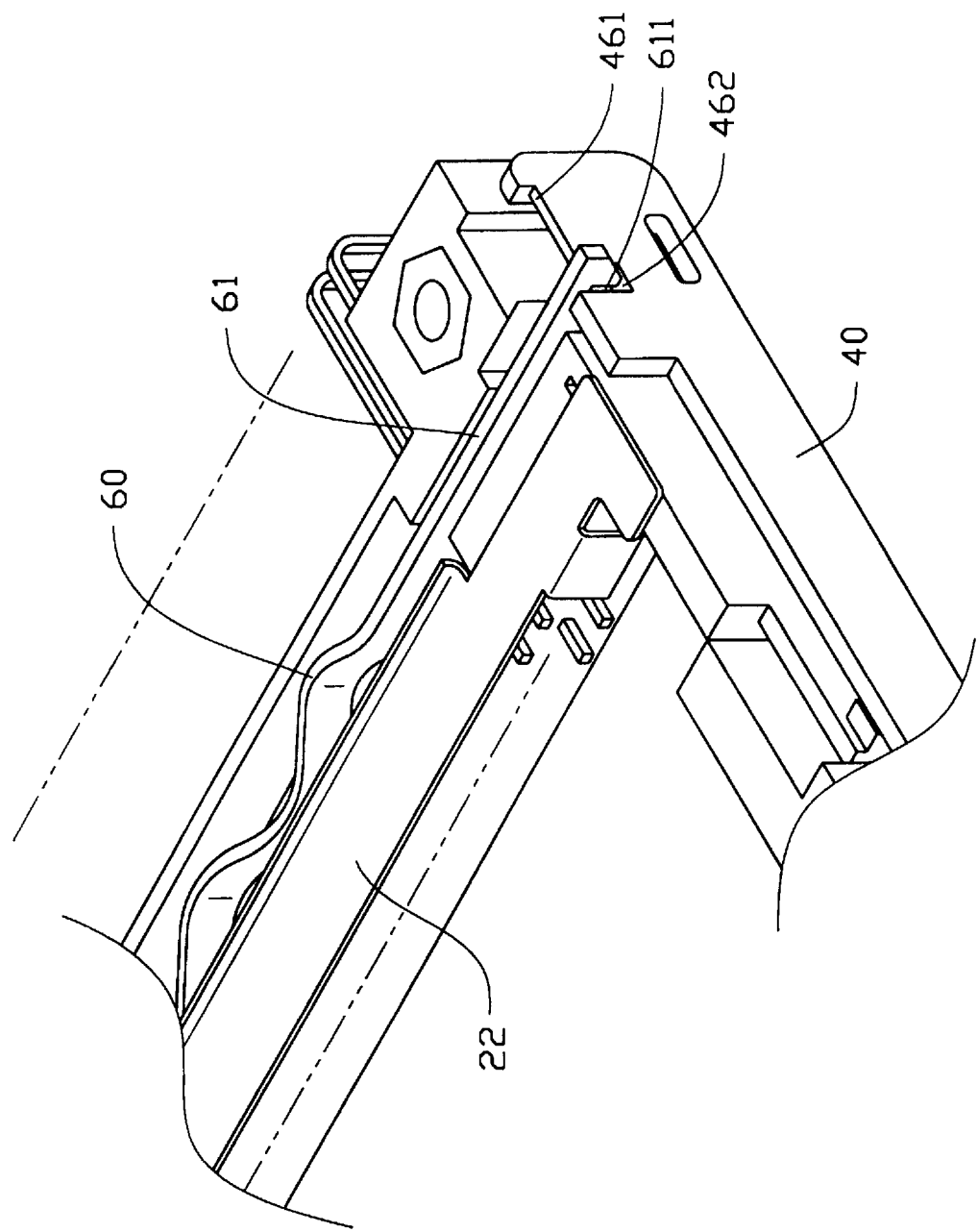
FIG. 6 is similar to FIG. 5 wherein the elastic means is released from the locked status and reaches a normal status.

If the handle portion 45 is depressed, the push bar 40 will move forward and the engagement between the elastic means 6 and the push bar 40 will be released through the upper cutout 462 of the push bar 40 as shown in FIG. 6. Specifically, the deformed tension from the deformable portion 60 of the elastic means 6 will retract the straight portion 61 into the receptacle 200 via the upper cutout 462 of the push bar 40 when the push bar 40 is pushed forward a distance D whereby the upper cutout 462 thereof aligns with the straight portion 61 of the elastic means 6. When the force is released from the handle portion 45 of the push bar 40, the push bar 40 returns to its original position due to the recovery force of the spring 43.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

What is claimed is:

1. An ejector mechanism for a connector comprising:

a receptacle;

elastic means deformably received in the receptacle;

an ejection plate adapted to force the elastic means to deform and store tension when an external card is manually inserted into the connector and exerts force on the ejection plate;

a retaining member movably retained in the connector for retaining the elastic means at a deformed status; and releasing means connected to the retaining member for releasing the retention force of the retaining member from the elastic means thereby causing the ejection plate to eject the card;

wherein the elastic means has a deformable portion and a straight portion extending from the deformable portion; and wherein the receptacle has an opening defined in a position laterally aligning with an extrapolated line of the straight portion of the elastic means and a thickness of the straight portion is less than the width of the opening.

2. The ejector mechanism as claimed in claim 1, wherein the receptacle is defined in a surface of a header of the connector which retains a plurality of contacts therein.

3. The ejector mechanism as claimed in claim 1, wherein the retaining member is a plate head having a tapered edge.

4. The ejector mechanism as claimed in claim 3, wherein the straight portion of the elastic means has a slant face at one end thereof confronting the tapered edge of the plate head of the push bar and defines a lower cutout near the slant face so that the slant face of the straight portion slides over the tapered edge of the plate head and the lower cutout thereof engages with the plate head thus retaining the deformation of the elastic means when the elastic means is deformed by the ejection plate.

5. The ejector mechanism as claimed in claim 4, wherein the releasing means comprises a plate body connected to the retaining member, an upper cutout being defined in the plate body adjacent to the plate head of the retaining member for releasing the retention of the plate head to the straight portion of the elastic means after the plate head is moved with respect to the lower cutout of the straight portion a predetermined distance until the upper cutout of the plate head notably engages with the lower cutout of the straight portion of the elastic means.

6. The ejector mechanism as claimed in claim 5 further comprising a spring connected to an intermediate portion of the plate body for returning the plate body to its original position after the plate body is moved forward.

7. The ejector mechanism as claimed in claim 6, wherein the ejection plate has a curved wall for abutting and deforming the deformable portion of the elastic means in response to insertion of a card into the connector.

8. The ejector mechanism as claimed in claim 7, wherein the deformable portion of the elastic means is a wave-shaped structure.

9. An ejector mechanism for a card connector comprising:

elastic means being deformable to store tension thereof when an external card is manually fully inserted into the connector;

retaining member positioned around and retaining the elastic means and including a portion latchably engaged with a portion of deformed elastic means; and releasing means positioned adjacent to the retaining member and adapted to disengage the elastic means from the retaining member whereby the inserted card can be ejected from the connector by a recovery force of the deformed elastic means.

10. The mechanism as claimed in claim 9, wherein the releasing means is moved parallel to an insertion direction of the card.

* * * * *